(12) United States Patent
Li et al.

(10) Patent No.: US 11,825,626 B1
(45) Date of Patent: Nov. 21, 2023

(54) BRACKET ASSEMBLY AND BRACKET STRUCTURE AND SERVER ASSEMBLY

(71) Applicant: Fulian Precision Electronics (Tianjin) Co., LTD., Tianjin (CN)

(72) Inventors: Yang Li, Tianjin (CN); San-Long Zhou, Tianjin (CN); Han-Yu Li, New Taipei (TW); Wen-Hu Lu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/856,100

(22) Filed: Jul. 1, 2022

(30) Foreign Application Priority Data

May 18, 2022 (CN) .......................... 202210551905.2

(51) Int. Cl.
*H05K 7/14* (2006.01)

(52) U.S. Cl.
CPC ................................ *H05K 7/1489* (2013.01)

(58) Field of Classification Search
CPC .... A47B 2210/0054; A47B 2210/0059; A47B 2210/0051; A47B 88/43; A47B 96/07; A47B 96/06; A47B 96/068; H05K 4/1489
USPC ......... 312/334.4, 334.5, 223.1, 265.1, 265.2, 312/265.3, 265.4
See application file for complete search history.

(56) References Cited

U.S. PATENT DOCUMENTS

| | | | | |
|---|---|---|---|---|
| 3,292,986 | A | * 12/1966 | Fenwick | A47B 88/487 312/333 |
| 6,122,173 | A | * 9/2000 | Felcman | G06F 1/16 312/223.1 |
| 6,418,011 | B2 | * 7/2002 | Omori | G11B 33/124 248/65 |
| 6,614,654 | B2 | * 9/2003 | Liu | G06F 1/187 361/801 |
| 6,813,148 | B2 | * 11/2004 | Hsu | G11B 33/124 248/225.11 |
| 7,830,656 | B2 | * 11/2010 | Ding | G06F 1/187 361/679.37 |
| 7,929,279 | B2 | * 4/2011 | Liu | G06F 1/181 211/184 |

(Continued)

FOREIGN PATENT DOCUMENTS

EP 0037257 A1 * 10/1981
KR 20170135440 A * 12/2017

(Continued)

*Primary Examiner* — Kimberly T Wood
(74) *Attorney, Agent, or Firm* — ScienBiziP, P.C.

(57) ABSTRACT

A bracket assembly for a server to prevent tilting during transportation includes at least two cabinet columns and two brackets. The two brackets are spaced apart from each other. The at least two cabinet columns fixed on the two brackets. Each bracket includes a fixing portion, a supporting portion, and at least one protrusion. The supporting portion extends from an edge of the fixing portion toward the other bracket, the protrusion from the fixing portion is spaced apart from the supporting portion. The supporting portion and protrusion are disposed on a same side of the fixing portion. A bracket structure and server assembly includes the bracket assembly and a housing, each of two parallel sidewalls of the housing has a sliding groove to clamp the protrusions.

12 Claims, 5 Drawing Sheets

(56) References Cited

U.S. PATENT DOCUMENTS

| | | | | |
|---|---|---|---|---|
| 9,010,887 | B1* | 4/2015 | Shao | H05K 7/1489 |
| | | | | 312/319.1 |
| 2001/0055200 | A1* | 12/2001 | Omori | G11B 33/124 |
| | | | | 361/752 |
| 2010/0140195 | A1* | 6/2010 | Henderson | H05K 7/1489 |
| | | | | 211/13.1 |
| 2011/0101832 | A1* | 5/2011 | Tang | G06F 1/183 |
| | | | | 312/223.1 |
| 2011/0279956 | A1* | 11/2011 | Sun | H05K 7/1489 |
| | | | | 361/679.02 |
| 2021/0022497 | A1* | 1/2021 | Nahin | A47B 88/48 |
| 2021/0161293 | A1* | 6/2021 | Coyle, Jr. | A47B 95/008 |

FOREIGN PATENT DOCUMENTS

| | | |
|---|---|---|
| TW | 539148 U | 6/2003 |
| TW | M430122 U | 5/2012 |

\* cited by examiner

BRACKET ASSEMBLY AND BRACKET STRUCTURE AND SERVER ASSEMBLY

FIELD

The subject matter herein generally relates to serve constructions, and more particularly, to a bracket assembly and a bracket structure and server assembly.

BACKGROUND

During a transportation of a server, for security reasons, one end of the server is usually fixed on a column cabinet, and the other end (the tail end) of the server is pressed by a pressing sheet to prevent the tail end from being tilted. However, the pressing sheet needs to be modified to adapt to different servers, resulting in an increased cost. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
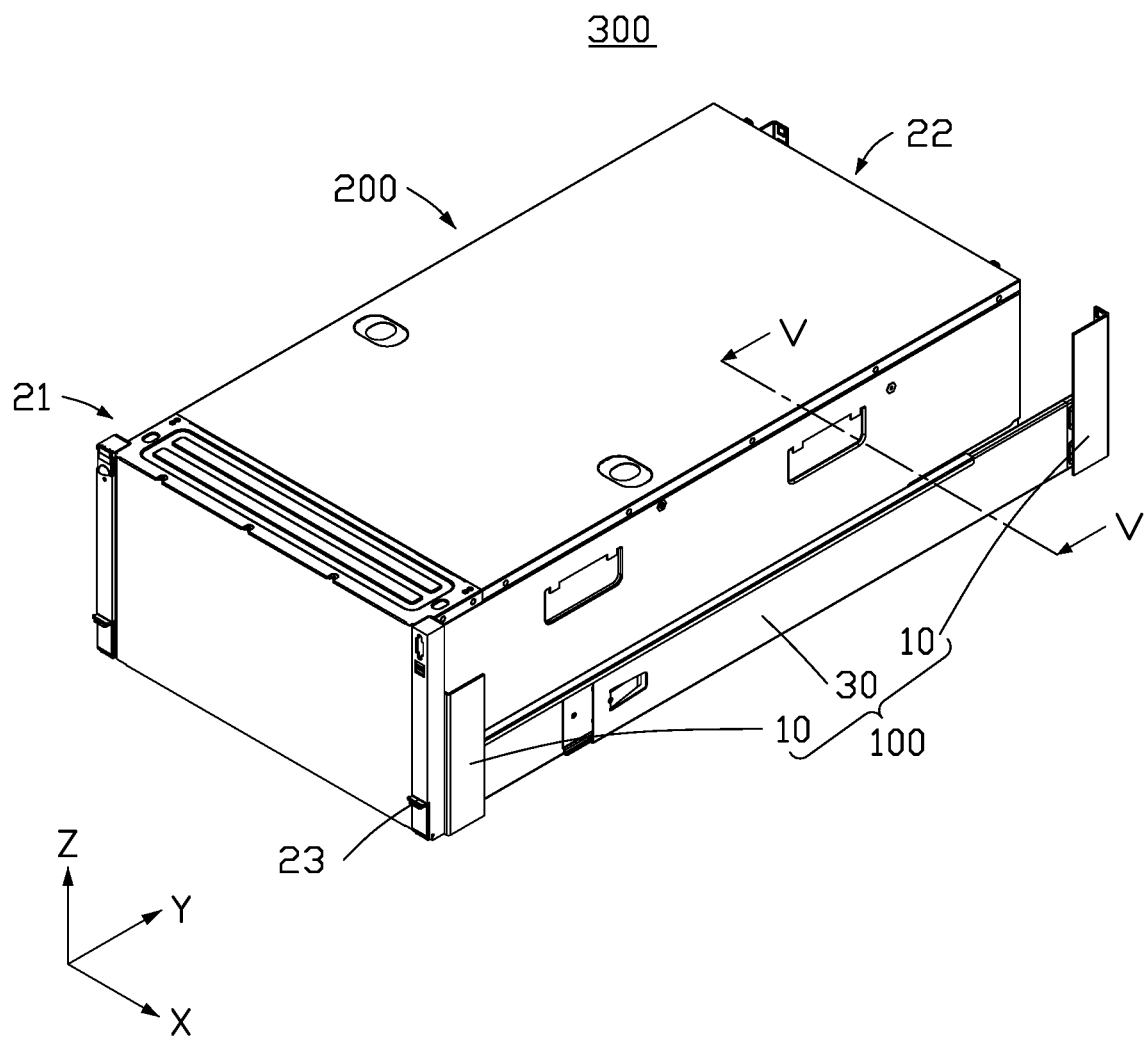
FIG. 1 is a diagrammatic view of an embodiment of a bracket structure and a server assembly according to the present disclosure, when the server is assembled to the bracket.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Referring to FIG. 1, a bracket structure and server assembly 300 is provided according to an embodiment of the present disclosure. The server component 300 includes a server 200 and a bracket assembly 100. The bracket assembly 100 is used to carry and fix the server 200 to prevent the server 200 from being tilted or shaken during transportation.

The server 200 is substantially a cuboid structure. Directions of width, length, height of the server 200 are defined as X-axis, Y-axis, and Z-axis, respectively. The X-axis, the Y-axis, and the Z-axis are perpendicular to each other. In actual use, the Z-axis is the direction of gravity.

The server 200 may be, but not limited to, a storage server, an AI server, an AI and computing composite server, and the like.

The server 200 includes a first end 21 and a second end 22 opposite to each other. When the server 200 is assembled to the bracket assembly 100, the second end 22 is fitted to the bracket assembly 100 first, and then the first end 21 is fitted to the bracket assembly 100 later. In the embodiment, a mounting ear 23 is provided on the first end 21. After the server 200 is assembled to the bracket assembly 100, the mounting ear 23 clamps the first end 21 with the bracket assembly 100. In other embodiments, the first end 21 and the bracket assembly 100 may also be fixed in other manner.

Figure 2:
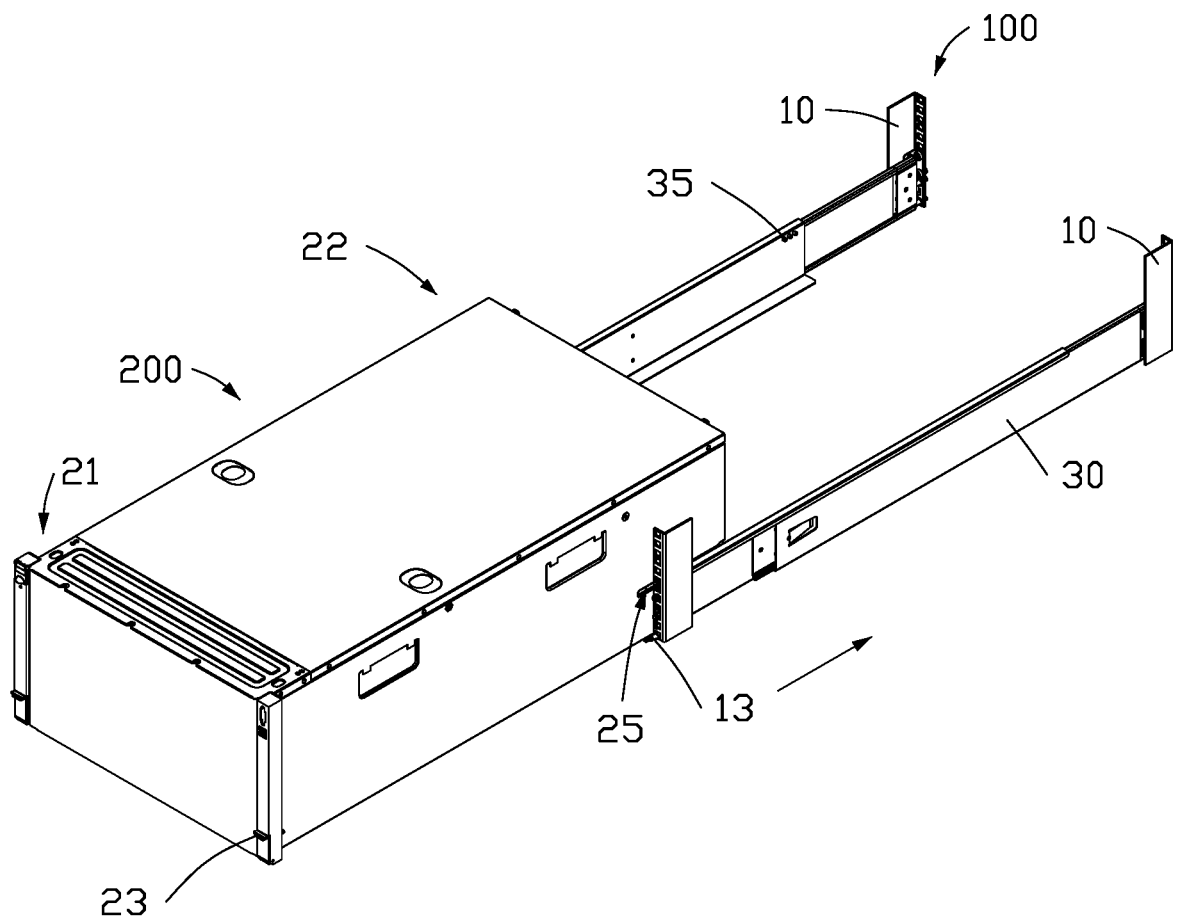
FIG. 2 is a diagrammatic view before the server being assembled to the bracket assembly of FIG. 1.

Referring to FIG. 2, the bracket assembly 100 includes at least two cabinet columns 10 and at least two brackets 30. The cabinet columns 10 and the brackets 30 are assembled as a whole. In the embodiment, four cabinet columns 10 are fixedly connected to two brackets 30. The four cabinet columns 10 are disposed at intervals along the Y-axis, and each of the four cabinet columns 10 extends along the Z-axis. The projections of the four cabinet columns 10 along the Z-axis are the four vertices of a rectangle. The two brackets 30 are disposed at intervals along the X-axis, and each of the two brackets 30 extends along the Y-axis. Each bracket 30 is fixed to two of the four cabinet columns 10. In other embodiments, the numbers of the cabinet columns 10 and the brackets 30 may be changed according to actual assembly requirements.

Each cabinet column 10 defines multiple through holes 11, and the multiple through holes 11 are disposed along the Z-axis. Each of the through holes 11 allows a fastener 12 (e.g., a bolt or nut) to pass through, thereby fixing the brackets 30 to the cabinet columns 10. Thus, a height of the brackets 30 relative to the cabinet columns 10 can be adjusted by inserting the fastener 12 into different through holes 11 according to actual needs.

An extending portion 13 is provided on the cabinet column 10 close to the first end 21. The extending portion 13 extends along the Y-axis away from the cabinet column 10. The extending portion 13 cooperates with the mounting ear 23 to clamp the first end 21 on the bracket assembly 100.

Figure 3:
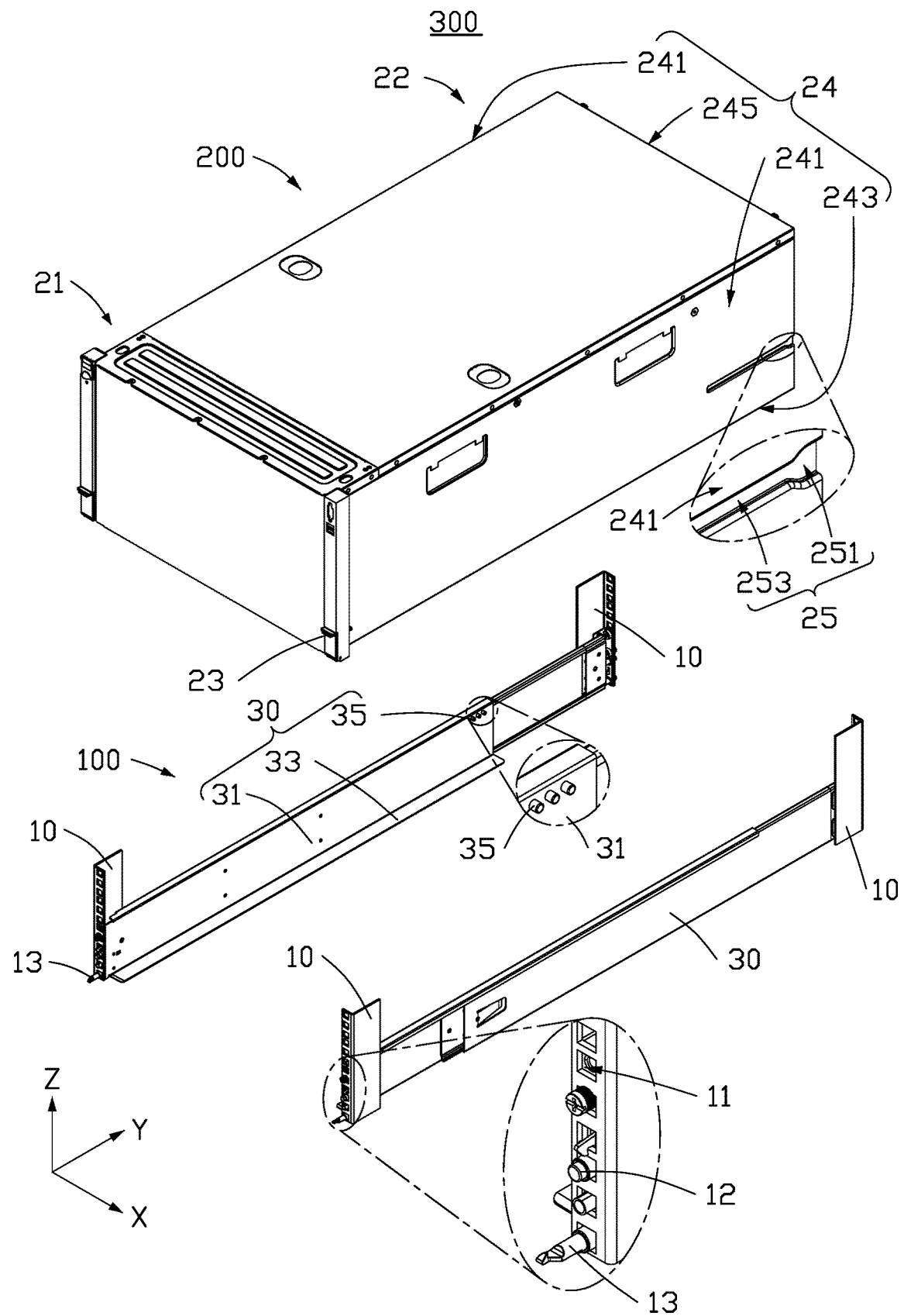
FIG. 3 is an exploded view of the bracket structure and the server assembly of FIG. 1.
Figure 4:
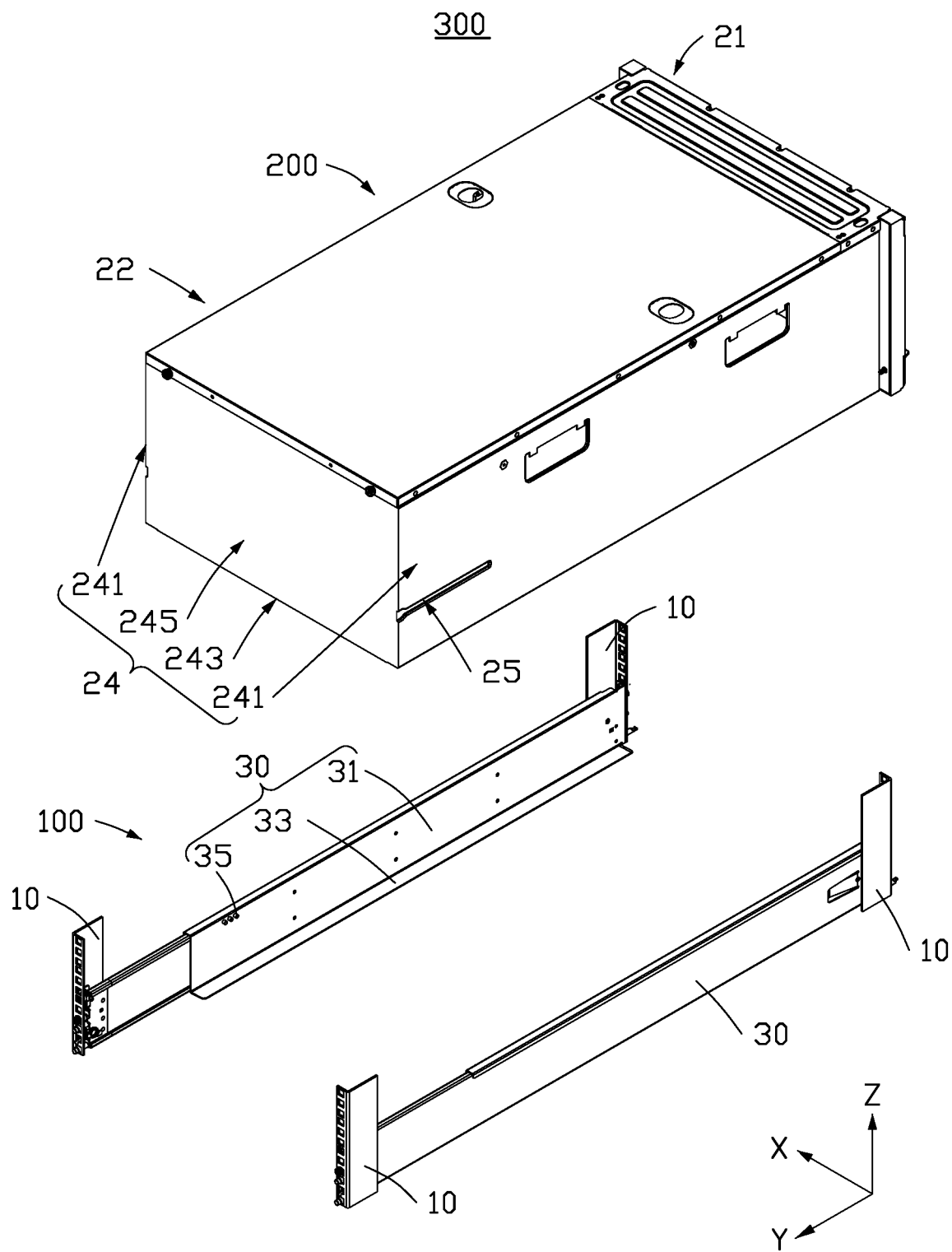
FIG. 4 is similar to FIG. 2, but showing the bracket structure and the server assembly from another angle.

Referring to FIGS. 3 and 4, each bracket 30 includes a fixing portion 31 and a supporting portion 33 fixed together. Both the fixing portion 31 and the supporting portion 33 extend along the Y-axis. The supporting portion 33 of one bracket 30 is formed by an edge of the fixing portion 31 extending toward the other bracket 30, and a cross-section of each bracket 30 perpendicular to the Y-axis is substantially L-shaped. The fixing portion 31 is disposed in the YZ plane and fixed to the cabinet columns 10. The supporting portion 33 is disposed in the XY plane, the supporting portions 33 of the two brackets 30 are in the same plane and extend inwardly to support the server 200.

Each bracket 30 further includes at least one protrusion 35 disposed on the fixing portion 31. The protrusion 35 extends from the fixing portion 31 along the X-axis. The protrusion 35 and the supporting portion 33 are disposed on the same side of the fixing portion 31. In the embodiment, the protrusion 35 is riveted on the fixing portion 31. In other embodiments, the protrusion 35 and the fixing portion 31 may be fixed in other manner, and may also be an integral structure.

The protrusions 35 provided on each bracket 30 are disposed close to the two cabinet columns 10 on the same side. That is, the protrusion 35 on each bracket 30 is disposed on the side where the second end 22 of the server 200 is disposed, so that the protrusion 35 can act on the second end 22 of the server 200. In addition, since the protrusion 35 is disposed on the inner side of each bracket 30, the protrusion 35 is prevented from colliding or scratching with external objects, thereby improving the service life of the brackets 30.

The server 200 includes a housing 24. The housing 24 includes two sidewalls 241, an end wall 245, and a bottom wall 243. The two sidewalls 241 are spaced from and parallel to each other. The end wall 245 and the bottom wall 243 are vertically connected to each other. The end wall 245 is connected to the two sidewalls 241, and the bottom wall 243 is connected to the two sidewalls 241. The two sidewalls 241 are disposed in the YZ plane, the end wall 245 is disposed in the XZ plane. The second end 22 includes the end wall 245. The bottom wall 243 is disposed in the XY plane. When the server 200 is placed on the brackets 30, the bottom wall 243 is connected to the supporting portion 33, and the sidewall 241 is spaced from the fixing portion 31.

Figure 5:
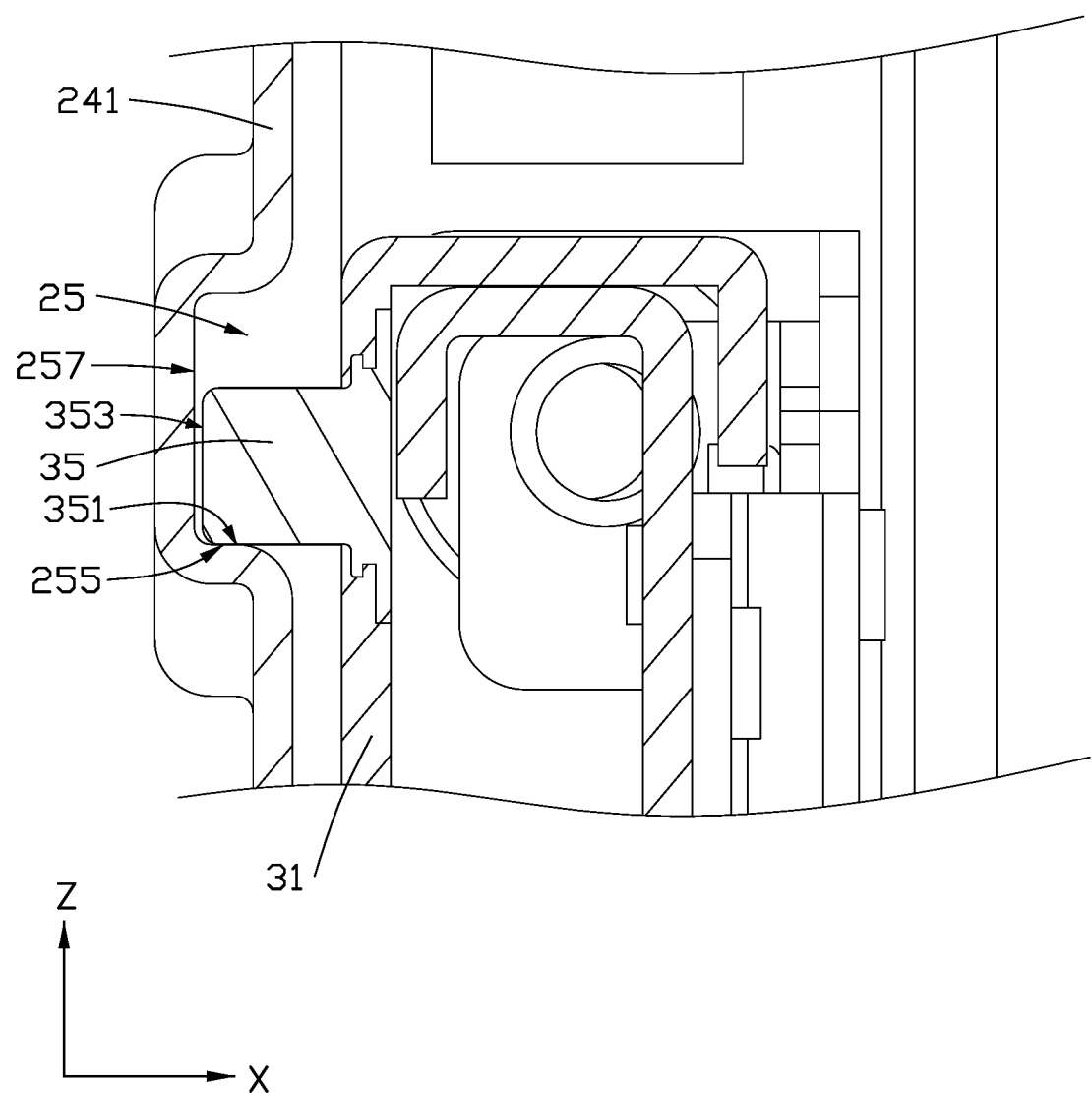
FIG. 5 is a cross-sectional view along line V-V in FIG. 1.

Referring to FIG. 5, a sliding groove 25 is defined on each sidewall 241. Each sliding groove 25 extends along the Y-axis from the connecting region between the sidewall 241 and the end wall 245. A distance between the bottom wall 243 and the sliding groove 25 along the Z-axis is substantially equal to a distance between the protrusion 35 and the supporting portion 33 along the Z-axis. Thus, when the server 200 is placed on the brackets 30, the protrusion 35 can be clamped within the sliding groove 25.

The sliding groove 25 includes an opening 251 and a slideway 253. The opening 251 communicates with the slideway 253. The opening 251 is defined at an end of the slideway 253, and the opening 251 is close to the end wall 245. The slideway 253 is disposed on the side of the opening 251 away from the end wall 245 and extends along the Y-axis. When placing the server 200 on the brackets 30, the protrusion 35 enters the opening 251 and then slides into the slideway 253, and at least a portion of the protrusion 35 is accommodated in the slideway 253. The protrusion 35 can limit a movement of the server 200 along the Z-axis, so as to prevent the second end 22 of the server 200 from being tilted.

Furthermore, along the Z-axis, a width of the opening 251 is greater than a width of the slideway 253, which facilitates the entry of the protrusion 35 into the slideway 253 when the server 200 is placed on the brackets 30.

Referring to FIG. 2, during the assembly process, the second end 22 is first placed on the supporting portion 33 and slides along the Y-axis. The protrusion 35 enters the opening 251 and then slides along the slideway 253. Referring to FIG. 1, when the server 200 reaches a preset position, the first end 21 is fixed on the cabinet columns 10, so that the server 200 is fixed on the bracket assembly 100 as a whole.

Referring to FIG. 5, when the protrusion 35 is clamped within the sliding groove 25, a surface 351 of the protrusion 35 facing the supporting portion 33 can be in contact with an inner sidewall 255 of the sliding groove 25. During the transportation of the bracket structure and server assembly 300, the second end 22 of the server 200 also acts to prevent tilting and shaking.

When the protrusion 35 is clamped within the sliding groove 25, a surface 353 of the protrusion 35 facing away from the fixing portion 31 and a bottom surface 257 of the sliding groove 25 are spaced apart from each other. That is, the surface 353 of the protrusion 35 facing away from the fixing portion 31 does not directly contact the bottom surface 257 of the sliding groove 25. When the protrusion 35 slides into the slideway 253 from the opening 251, a friction force between the protrusion 35 and the sliding groove 25 is reduced.

In some embodiments, there are multiple protrusions 35 arranged along the Y-axis. When the server 200 is very heavy, the multiple protrusions 35 as a hole can have an increased strength. At the same time, after some protrusions 35 may be broken, other unbroken protrusions 35 still prevent the server 200 from being tilted.

The protrusions 35 are made of a material with relatively high hardness, such as metal or metal alloy, so as to improve a service life of the brackets 30.

The bracket structure and server assembly 300 of the present disclosure includes the bracket assembly 100 and the server 200. The sliding groove 25 is defined on the server 200, the protrusions 35 are provided on the bracket assembly 100 that match the sliding groove 25. After the server 200 is assembled to the bracket assembly 100, the first end 21 of the server 200 is fixed on the cabinet columns 10, and the second end 22 is limited by the sliding groove 25 and the protrusions 35, thereby fixing the server 200 to the bracket assembly 100 as a whole, preventing the bracket structure and server assembly 300 from being tilted during transportation. The assembly process is simple, only needing to slide the protrusions 35 into the sliding groove 25. Furthermore, when assembling the server 200 to the bracket assembly 100, the second end 22 of the server 200 is fixed to the cabinet columns 10, no additional fixing steps are needed. Thus, it is suitable for different types of servers 200, and the cost is low.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A bracket structure and server assembly, comprising
   a bracket assembly comprising
      at least two cabinet columns; and
      two brackets spaced apart from each other, the at least two cabinet columns fixed on the two brackets, each of the two brackets comprising a fixing portion, a supporting portion, and at least one protrusion; the supporting portion of one of the two brackets extending from an edge of the fixing portion toward the other of the two brackets; the at least one protrusion protruding from the fixing portion and spaced apart from the supporting portion, and the supporting portion and the at least one protrusion disposed on a same side of the fixing portion; and
   a server comprising a housing, the housing comprising two sidewalls and an end wall, the two sidewalls parallel to and spaced apart from each other, the end wall connected to the two sidewalls, a sliding groove defined on each of the two sidewalls, the sliding groove formed by each of the two sidewalls being recessed, the sliding groove extending along a length direction of the sever from a connecting region between each of the two sidewalls and the end wall, the length direction perpendicular to a direction of gravity; wherein each sliding groove comprises an opening and a slideway, the opening is defined at an end of the slideway, and the at least one protrusion is configured to be clamped within the sliding groove.

2. The bracket structure and server assembly of claim 1, wherein a width of the opening is greater than a width of the slideway.

3. The bracket structure and server assembly of claim 1, wherein the at least one protrusion comprises a plurality of protrusions arranged in a row, and the plurality of protrusions is parallel to a plane where the supporting portion is disposed.

4. The bracket structure and server assembly of claim 1, wherein when the at least one protrusion is clamped in the sliding groove, a surface of the protrusion facing the supporting portion is in contact with an inner sidewall of the sliding groove.

5. The bracket structure and server assembly of claim 2, wherein when the at least one protrusion is clamped in the sliding groove, a surface of the protrusion facing the supporting portion is in contact with an inner sidewall of the sliding groove.

6. The bracket structure and server assembly of claim 3, wherein when the at least one protrusion is clamped in the sliding groove, a surface of the protrusion facing the supporting portion is in contact with an inner sidewall of the sliding groove.

7. The bracket structure and server assembly of claim 1, wherein when the at least one protrusion is clamped within the sliding groove, a surface of the protrusion facing away from the fixing portion is spaced apart from a bottom surface of the sliding groove.

8. The bracket structure and server assembly of claim 2, wherein when the at least one protrusion is clamped within the sliding groove, a surface of the protrusion facing away from the fixing portion is spaced apart from a bottom surface of the sliding groove.

9. The bracket structure and server assembly of claim 3, wherein when the at least one protrusion is clamped within the sliding groove, a surface of the protrusion facing away from the fixing portion is spaced apart from a bottom surface of the sliding groove.

10. The bracket structure and server assembly of claim 1, wherein the at least one protrusion is made of metal or metal alloy.

11. The bracket structure and server assembly of claim 2, wherein the at least one protrusion is made of metal or metal alloy.

12. The bracket structure and server assembly of claim 3, wherein the at least one protrusion is made of metal or metal alloy.

* * * * *